(12) United States Patent  Nakahara

(10) Patent No.: US 6,627,038 B2
(45) Date of Patent: Sep. 30, 2003

(54) PROCESSING CHAMBER

(75) Inventor: Takashi Nakahara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 57 days.

(21) Appl. No.: 09/845,283

(22) Filed: May 1, 2001

(65) Prior Publication Data

US 2001/0039922 A1 Nov. 15, 2001

(30) Foreign Application Priority Data

May 9, 2000 (JP) ........................................ 2000-136117

(51) Int. Cl.[7] .............................. C23F 1/00; C23C 16/00
(52) U.S. Cl. .................................. 156/345.29; 118/715
(58) Field of Search ............................ 118/715, 723 R; 156/345.29, 345.1; 204/298.07, 298.33

(56) References Cited

U.S. PATENT DOCUMENTS 5,578,132 A  * 11/1996  Yamaga et al. ............. 118/715
6,156,151 A  * 12/2000  Komino et al. ............. 118/715

* cited by examiner

*Primary Examiner*—Luz L. Alejandro
(74) *Attorney, Agent, or Firm*—Fitzpatrick, Cella, Harper & Scinto

(57) ABSTRACT

A processing chamber is provided which comprises an upper chamber having a stage, a lower chamber which is connectable to and separable from the upper chamber, and an exhaust path, wherein the exhaust path has a separator with an exhaust port which is connectable to and separable from a connector of an exhaust duct, and the separator is configured so as to be able to move together with the lower chamber.

9 Claims, 5 Drawing Sheets

PROCESSING CHAMBER

BACKGROUND OF THE INVENTION

1. Field of the Invention

The present invention relates to a processing chamber that is mainly used as apparatuses for producing semiconductor devices or the like, and it is to be connected to an exhaust system for exhausting the inside of a chamber of such apparatuses.

2. Related Background Art

In the production of semiconductor devices or the like, there are used apparatuses in which an article to be processed (hereinafter, simply referred to as "article") is placed in a processing chamber, the inside of the processing chamber is exhausted, and a desired processing is carried out therein.

Taking the ashing apparatuses as an example, ashing apparatuses have recently been required to be produced at low cost and to have a high throughput. Therefore, it is necessary to shorten the operation cycle of the chamber in order to reduce the processing time as a factor of the throughput.

A processing chamber used in the ashing apparatus generally has an inner structure of an approximately cylindrical shape, which defines a vacuum vessel capable of being separated into an upper chamber 1 and a lower chamber 2 as shown in FIGS. 4 and 5. Further, the ceiling portion of the upper chamber 1 is provided with a dielectric member 6 such as a quartz plate and a high frequency power supply (not shown), and the lower chamber 2, which is opposite to the upper chamber 1, is provided with a wafer stage 9 having a temperature raising equipment.

When a wafer W as an article is placed on the wafer stage 9, the lower chamber 2 with the wafer stage 9 is moved downward to an wafer exchange (or delivery) position by a considerable distance (designated by an opening distance B in FIG. 5), and the wafer is exchanged by means of a hand 15 of a wafer transferring robot (not shown).

Generally, the operation cycle of the processing chamber comprises the total time of wafer exchanging time, closing time of the lower chamber, vacuum drawing time, plasma-on time, gas introducing time, atmospheric pressure recovering time, and chamber opening time. Therefore, in a case where other units of the ashing apparatus are sufficiently operable within a predetermined time, the throughput of the ashing apparatus depends on the operation cycle of the chamber, especially at the opening and closing time.

Specifically, since the opening and closing time of the lower chamber 2 that is as a factor of the chamber cycle consists of two operations that are both of an opening operation and a closing operation, the operation time thereof has a great influence on the throughput of the apparatus.

However, the operation of the lower chamber 2 has a large operation stroke as described above, so that the operation time thereof will be long. This is attributable to the structure of the chamber. In the prior art chamber, since the side wall of the upper chamber is provided with an introducing port for a processing gas, an introducing port for a purge gas, and an exhaust duct E1 also serving as an exhaust port for drawing a vacuum, the length in the vertical direction is large.

On the other hand, the distance between the upper surface of the wafer stage 9 (i.e., wafer stage surface) of the lower chamber 2 and the dielectric member 6 of the upper chamber 1 needs to be set to an optimum value for fully attaining the processing performance and it is set as small distance as possible in most cases. The structure of the lower chamber satisfying both the conditions is of such a protrusion shape that the wafer stage surface intrudes deeply into the upper chamber from the chamber separation surface by a distance (designated by distance C in FIG. 5) in the closed state, so that the opening distance B for moving the lower chamber to the wafer exchange position will become large.

In FIGS. 4 and 5 reference numeral 3 refers to a microwave introducing part through which microwaves introduced by microwave waveguide MW are introduced. As shown in FIG. 4, body 8 (partly shown) is connected to upper chamber 1. As shown in FIGS. 4 and 5, a seal ring 10 is provided in contact with the lower chamber 2. Lift pin 11, shown in FIGS. 4 and 5, is used to lift the wafer W. Reference numeral 10 refers to a sealing ring, shown in FIGS. 4 and 5. Reference numeral 13 refers to a flange portion, shown in FIGS. 4 and 5.

SUMMARY OF THE INVENTION

It is an object of the present invention to provide a processing chamber that can reduce the opening and closing time of the chamber and improve the throughput of the processing without complicating the structure of the chamber and the opening and closing operation.

It is another object of the present invention to provide a processing chamber that can reduce the opening distance of the lower chamber.

According to an aspect of the present invention, there is provided a processing chamber comprising a stage, an upper chamber, a lower chamber which is connectable to and separable from the upper chamber, and an exhaust path, wherein the exhaust path has a separator with an exhaust port which is connectable to and separable from a connector of an exhaust duct, and the separator is configured so as to be able to move along with the lower chamber.

The connector preferably has an elastic member which is extendable in the moving direction of the lower chamber.

The elastic member is preferably a bellows which is capable of extending in the moving direction of the lower chamber.

The elastic member is preferably a rubber for vacuum seal.

The connector preferably has an elastic member which is extendable in the moving direction of the lower chamber and a flange to be in close contact via a sealant with a separation surface of the separator.

The sealant is preferably a seal ring, and the diameter of the seal ring is preferably larger than that of the effective diameter of the bellows.

A separation surface of the lower chamber at a portion for putting an article into and out of the processing chamber is preferably at approximate the same level as an article placing surface of the stage.

A separation surface of the separator is preferably at approximate the same level as an article placing surface of the stage.

A flow path of inside the separator preferably communicates with the lower chamber through an opening formed at a location lower than an article placing surface of the stage.

It is preferable that the separator is separated from the connector of the exhaust duct when separating the upper chamber and the lower chamber from each other and is connected to the connector of the exhaust duct when connecting the upper chamber and the lower chamber to each other.

According to another aspect of the present invention, there is also provided a method of producing a semiconductor device, comprising the steps of:
provide the processing chamber as mentioned above;
providing a wafer; and
placing the wafer in the processing chamber and processing the wafer.
The processing of the wafer preferably comprises the step of ashing a resin provided on the wafer.

DETAILED DESCRIPTION OF THE PREFERRED EMBODIMENTS

Preferred embodiments of the present invention will be described in detail with reference to the attached drawings.

Embodiment 1

Figure 1:
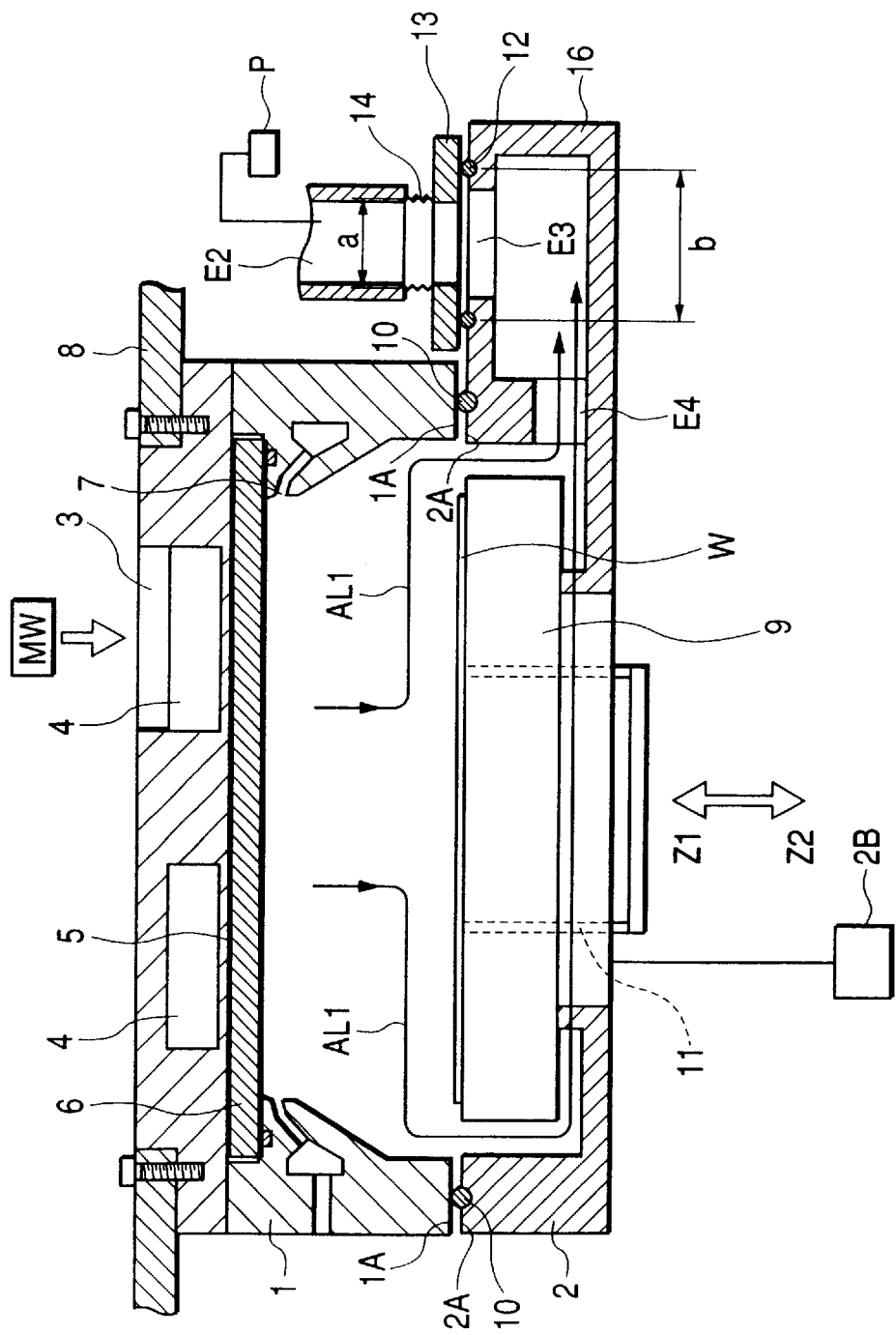
FIG. 1 is a schematic sectional view of a chamber in accordance with a first embodiment of the present invention.
Figure 2:
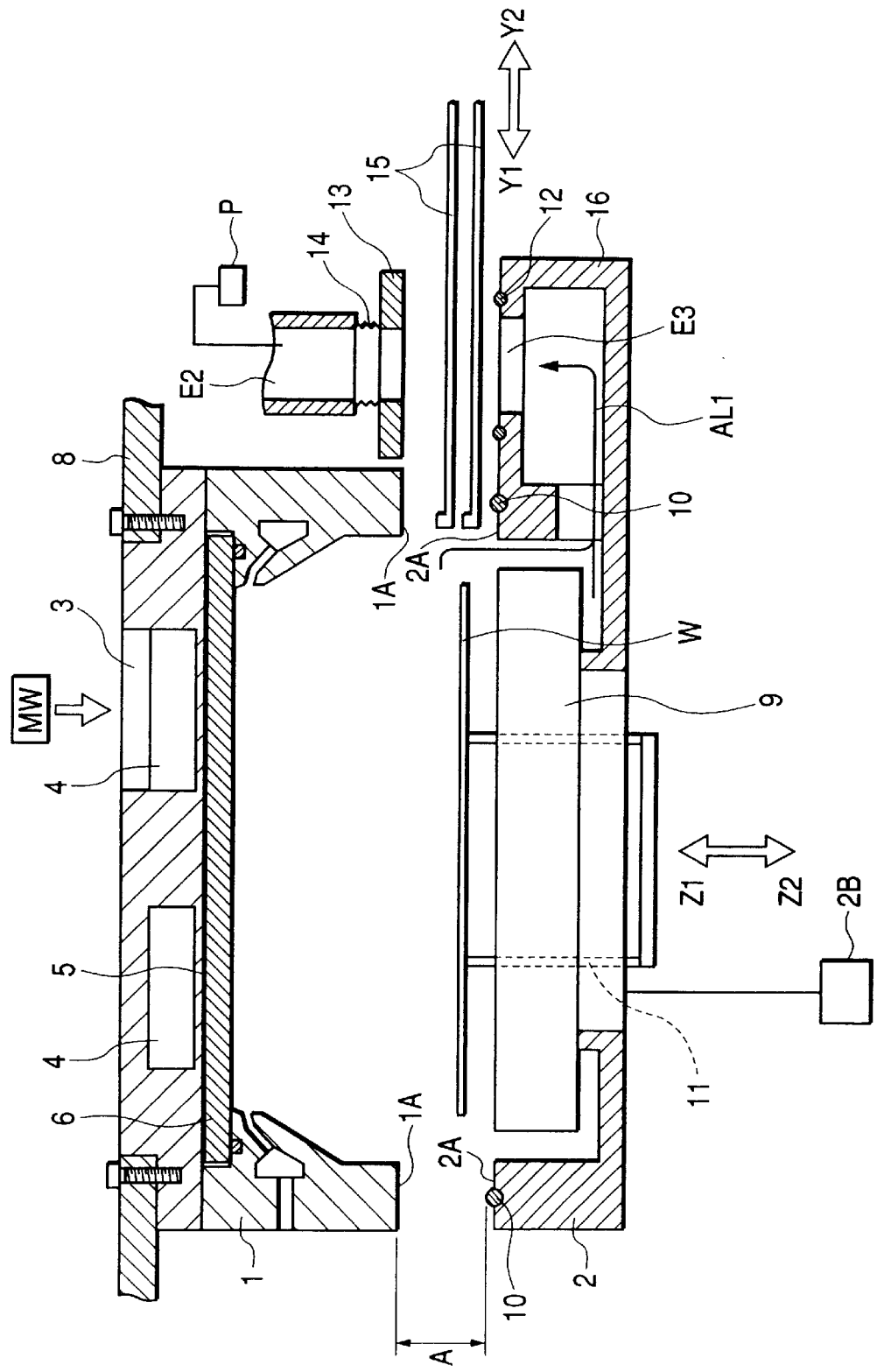
FIG. 2 is a schematic sectional view of a chamber in separated state.

FIG. 1 is a schematic sectional view of a chamber in accordance with an embodiment best embodying the present invention, and FIG. 2 is a schematic sectional view showing the separated state of the lower chamber during the exchange of a wafer.

In the figures, reference numeral 1 denotes an upper chamber that constitutes an upper part of a vacuum vessel. The upper chamber 1 is configured such that microwaves guided from a microwave waveguide MW connected to a microwave power source (not shown) are introduced into an endless circular waveguide 4 at the ceiling part through a microwave introducing port 3 and supplied into the chamber from an antenna 5 formed of a conductive plate with a plurality of slots (not shown) at the bottom of the waveguide 4 through a dielectric member 6. In place of the high frequency power supply consisting of the endless circular waveguide 4, another high frequency power supply consisting of a coil for an inductively coupled plasma (ICP) or an radial line slot antenna may be used.

Further, inside the upper chamber 1 is provided a nozzle 7 in an obliquely upward direction so as to enable optimal ejection of a processing gas, while inside the wall of the upper chamber is formed a gas supply path.

The lower chamber 2 that constitutes a lower part of the vacuum vessel is additionally provided with a seal ring 10 for vacuum-sealing the connection portion with the upper chamber 1, a wafer stage 9 for placing a wafer W thereon internally provided with a temperature raising equipment capable of heating the wafer W to raise the temperature as needed, and a lift pin 11 provided in the wafer stage 9 for lifting up the wafer W.

The upper chamber 1 and the lower chamber 2 are connected to each other at respective separation surfaces 1A and 2A so as to be separable from each other.

Further, in the lower side wall of the lower chamber 2 is formed an opening E4 the outer end of which is provided with a separator 16 that constitutes an exhaust path.

The separator 16 of the exhaust path has a separation surface (i.e., upper surface) which is at approximate the same level as the level of the upper surface of the wafer stage 9 and further has an exhaust port upwardly opened in the separation surface, for drawing a vacuum. The separation surface of the separator having the exhaust port E3 formed is provided with an exhaust seal ring 12.

Above the separator 16 of the exhaust path is disposed a connector of an exhaust duct E2, which has a flange 13 integrally configured via a bellows 14 with the exhaust duct E2. The separator 16 is connected to the flange 13, and the exhaust seal ring 12 positioned at the contact portion vacuum-seals the connection portion between the upper surface with the exhaust port E3 and the lower surface of the flange 13.

Further, the lower chamber 2 with the separator 16 of the exhaust path is configured so as to be able to move together with the wafer stage 9 upwardly and downwardly in the directions of Z1 and Z2.

Incidentally, in this embodiment, the exhaust duct E2 is fixed to a body 8 (partly shown) connected to the upper chamber 1, and the exhaust side thereof, i.e., the downstream end of the gas flow path is connected to a vacuum pump P, thus forming a vacuum exhaust path in combination with the separator 16 with the exhaust port E3. That is, the drawing of a vacuum inside the processing chamber is effected by the vacuum pump P and the vacuum exhaust path. Further, the flange 13 may be formed integrally with the upper chamber 1.

At the contact portion of the exhaust duct E2 with the exhaust port E3 portion, a bellows 14 made of an elastic member and having an equalizing function is integrally connected to and configured with the flange 13. That is, the exhaust duct E2 and the exhaust port E3 are configured so as to be separable in the vertical direction with the exhaust seal ring surface consisting of the lower surface of the flange 13 of the connector and the upper surface of the separator 16 being a separation surface.

The processing chamber is configured such that the upward movement of the lower chamber 2 bring the separator 16 of the exhaust path into pressure-contact with the lower surface of the flange 13 to connect the exhaust duct E2 and the exhaust port E3 airtightly to each other, thereby maintaining the degree of vacuum of the chamber without a leak.

The processing gas supplied into the chamber through the nozzle 7 flows against the lower surface of the dielectric member 6 for supplying microwaves therethrough. The gas excited or decomposed by a plasma below the dielectric member or plasma species flows along the upper surface of the wafer W and the side surface of the wafer stage into the opening E4.

The flow of the gas in this way is preferable in order to uniformly process the wafer surface. In order to form this flow, the opening E4 is formed at a location below the upper surface of the wafer stage.

Here, the relation between the diameter of the bellows 14 of the exhaust duct E2 and the diameter of the exhaust seal ring 12 is defined such that the effective diameter b of the exhaust seal ring 12 is larger than that of the effective diameter a of the bellows 14. This is to avoid such situation that the bellows 14 may shrink during vacuum drawing of the chamber and the shrinkage power may break the vacuum seal at the portion of the flange 13 and also to intentionally press the flange 13 to the exhaust seal ring 12 utilizing the pressure difference resulting from the difference of effective diameters.

Next, the exchange of a wafer in the above configured chamber will be described.

In the processing state, i.e., in the chamber closed state shown in FIG. 1, after the processing of a wafer has been completed, a purge gas is introduced into the chamber from the nozzle to purge the inside of the chamber to come to equilibrium with the atmosphere.

After the recovery to atmospheric pressure has been completed, the lower chamber 2 is moved by an opening distance A shown in FIG. 2 (which illustrates the state after the movement) in the direction of Z2 to the wafer exchange position.

At this time, the wafer W has been lifted up by a given distance in the direction of Z1 to complete preparation for the exchange of the wafer. Receiving the preparation completion signal, the hand 15 of the robot moves in the directions of Y1 and Y2 to carry out exchange of the wafer. That is, the hand 15 of the robot passes through a portion for putting an article into and out of the chamber (simply referred to as "put in/out portion") as a space formed between the separation surface 2A of the lower chamber 2 which is at approximate the same level as the level of the upper surface of the wafer stage 9 and the separation surface 1A of the upper chamber 1 to intrude into the chamber and carries out exchange of the wafer.

Figure 4:
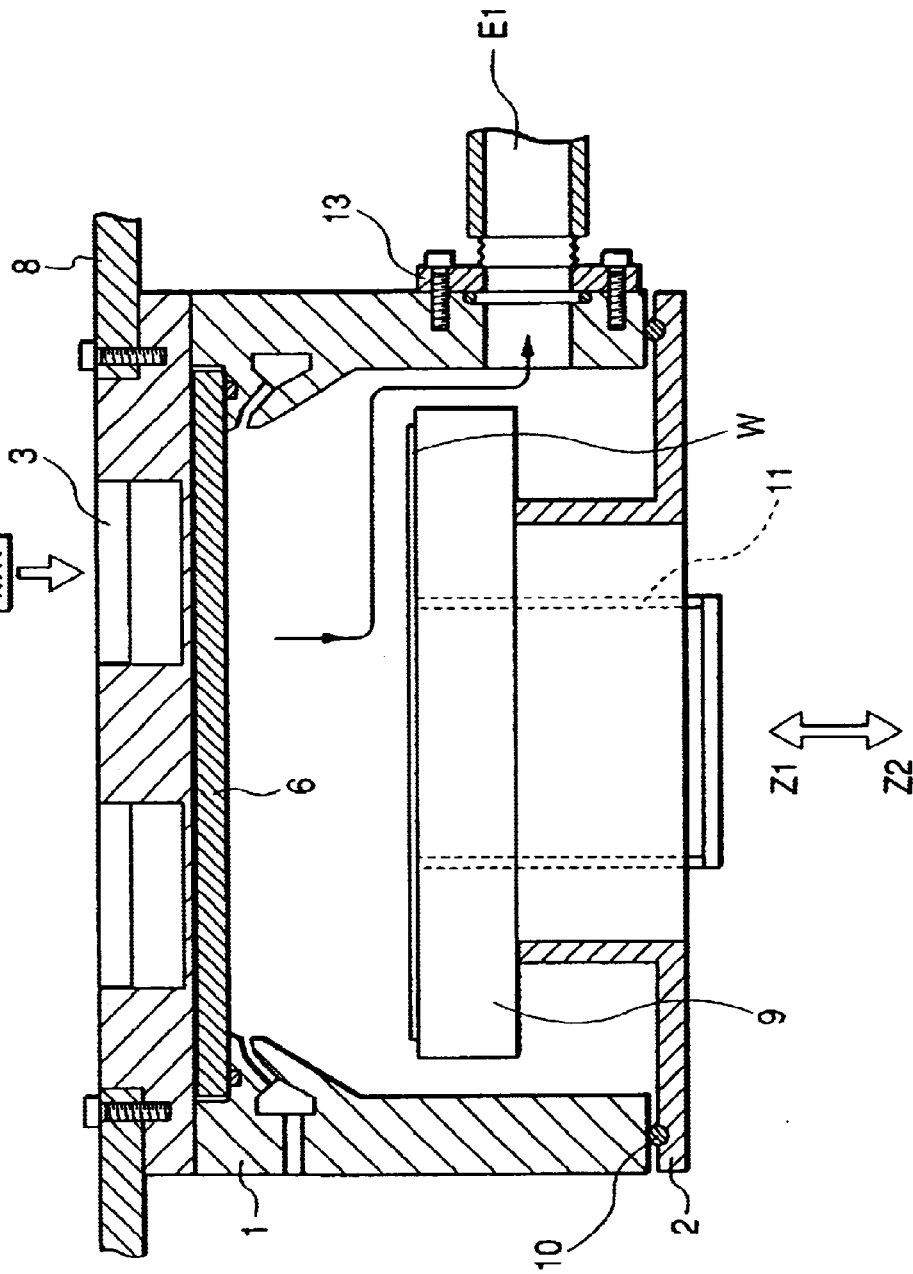
FIG. 4 is a schematic sectional view of a chamber in accordance with a comparative example.
Figure 5:
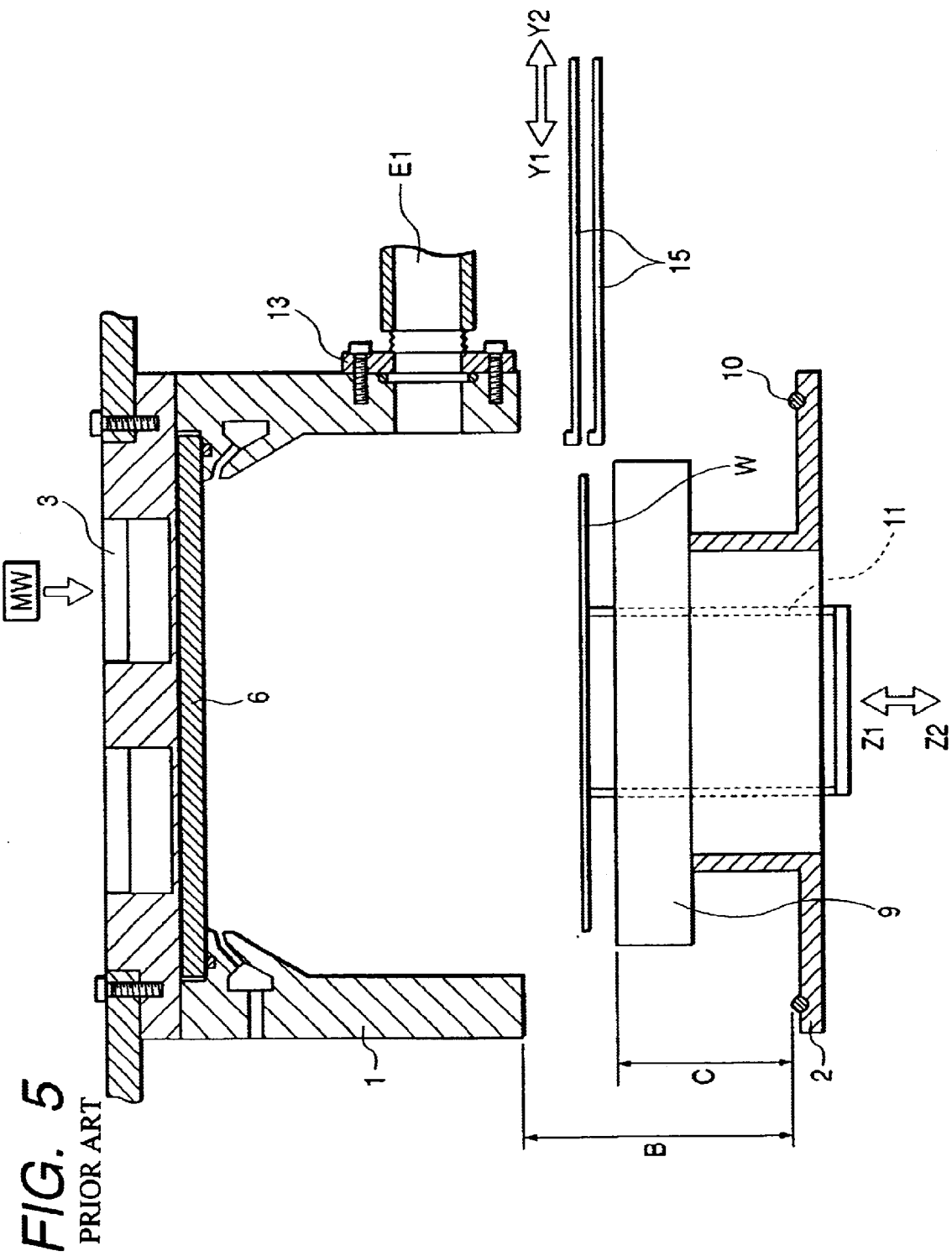
FIG. 5 is a schematic sectional view illustrating the state of exchange of a wafer in a chamber in accordance with a comparative example.

Here, FIGS. 1 and 2 illustrating the present embodiment will be compared with FIGS. 4 and 5 illustrating the prior art example. It is seen from comparison between the opening distances A and B that the opening distance B of the prior art chamber is larger by a distance C corresponding to the distance from the seal ring surface to the wafer stage surface than the opening distance A of the present embodiment. Therefore, in the present embodiment, the moving time of the lower chamber 2 can be reduced by the time required for movement of the distance C, with the result that the operation cycle of the chamber can be shortened to improve the throughput of the processing.

Embodiment 2

Figure 3:
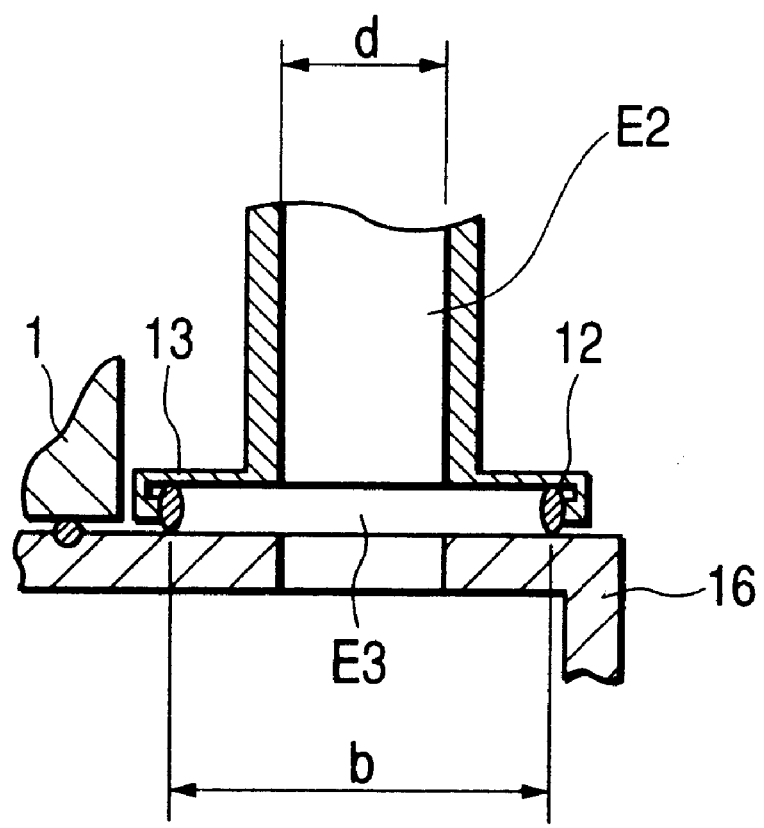
FIG. 3 is a schematic sectional view of a part of an exhaust system of a chamber in accordance with a second embodiment of the present invention.

FIG. 3 is a schematic partial sectional view illustrating a separation structure of a vacuum exhaust path of a chamber in accordance with a second embodiment of the present invention. The structure of a portion not illustrated of the chamber is the same as that shown in FIG. 1.

In this embodiment, one end of an exhaust duct E2 is fixed to a body 8 and an end of its extension is connected to a vacuum pump P.

Further, a flange 13 is configured integrally with the exhaust duct E2, an exhaust seal ring 12 made of an elastic member such as a rubber, resin, etc. is fitted at a part thereof, and this sealing surface and a connection surface of an exhaust port E3 side (i.e., separator side) are brought into pressure-contact with each other to effect vacuum sealing. That is, in the present embodiment, no bellows is used, and an elastic member such as a rubber is instead built in the flange 13 portion, which exhibits both elasticity and equalizing function, so that the same technical effect as that of Embodiment 1 can be attained at a lower production cost.

Although FIG. 2 illustrates the embodiment wherein a wafer as an article is put in and out of the chamber through the space in which the exhaust path is separated (or cut off), the space in which the exhaust path is separated and the wafer put in/out portion may be at different locations of the side surface of the chamber as long as the wafer put in/out portion formed by separation of the chamber is at approximate the same level as the level of the upper surface of the wafer stage. If the space in which the exhaust path is separated and the wafer put in/out portion are positioned apart from each other, the level of the separation surface with the exhaust port need not be at the same level as the level of the stage of upper surface or the separation surface of the lower chamber.

Next, a method of producing a semiconductor device using the processing chamber described above will be described.

First, a processing chamber with the structure shown in FIG. 1 and a wafer W are prepared.

The upper chamber 1 and the lower chamber 2 are separated from each other, and the wafer W is placed on the stage 9. At this time, the wafer W may be lifted up by the lift pin to be maintained apart from the stage 9.

Then, the lower chamber 2 is moved upwardly to close the chamber, while the separator 16 is connected to the connector of the exhaust duct to maintain the inside of the chamber and exhaust path airtightly.

Next, the inside of the chamber is exhausted through the exhaust path.

Then, a processing gas is supplied from the nozzle 7 and the pressure inside the chamber is kept at a given value.

Subsequently, a high frequency power such as microwaves is supplied into the chamber to generate a glow discharge thereby to give rise to a plasma, thus processing a surface of the wafer.

Thereafter, the pressure inside the chamber is brought into atmospheric pressure, the lower chamber is then moved downwardly to open the chamber, and the wafer is taken out.

The above processing is carried out repeatedly for every wafer.

The processing chamber in accordance with the present invention can be used for ashing of a resin such as a resist on a wafer, etching of a wafer surface, surface modification of a wafer surface, CVD on a wafer surface, plasma polymerization, and so on in production steps of semiconductor devices.

According to the present invention, since the throughput of the processing is improved, the production cost of semiconductor devices can be reduced.

As described above, according to the present invention, by separating the exhaust path, it is possible to reduce the opening distance of the lower chamber and thereby to shorten the operation cycle of the chamber, thus improving the throughput of the processing. Further, since the upward and downward moving mechanism for the lower chamber can be compactized because of the reduction in the moving distance, the whole size of the apparatus can be reduced to attain production cost reduction.

What is claimed is:

1. A processing chamber comprising a stage, an upper portion of the chamber, a lower portion of the chamber which is connectable to and separable from the upper portion of the chamber, and an exhaust path, wherein the exhaust path has a separator with an exhaust port which is connectable to and separable from a connector of an exhaust duct, and the separator is configured so as to be able to move along with the lower portion of the chamber, the connector having an elastic member that is extendable in a moving direction of the lower portion of the chamber when effecting connection and separation of the lower portion of the chamber.

2. The processing chamber according to claim 1, wherein the elastic member is a bellows which is extendable in the moving direction of the lower portion of the chamber.

3. The processing chamber according to claim 1, wherein the elastic member is a rubber for vacuum seal.

4. The processing chamber according to claim 1, wherein the connector has a flange in close contact via a sealant with a separation surface of the separator.

5. The processing chamber according to claim 4, wherein the sealant is a seal ring, and the diameter of the seal ring is larger than that of the effective diameter of the bellows.

6. The processing chamber according to claim 1, wherein a separation surface of the lower portion of the chamber at a portion for putting an article into and out of the processing chamber is at approximately the same level as an article placing surface of the stage.

7. The processing chamber according to claim 1, wherein a separation surface of the separator is at approximately the same level as an article placing surface of the stage.

8. The processing chamber according to claim 1, wherein a flow path inside the separator communicates with the lower portion of the chamber through an opening formed at a location lower than an article placing surface of the stage.

9. The processing chamber according to claim 1, 6, 7 or 8, wherein the separator is separated from the connector of the exhaust duct when separating the upper portion of the chamber and the lower portion of the chamber from each other and is connected to the connector of the exhaust duct when connecting the upper portion of the chamber and the lower portion of the chamber to each other.

* * * * *